(12) United States Patent
Huber et al.

(10) Patent No.: US 8,283,921 B2
(45) Date of Patent: *Oct. 9, 2012

(54) MAGNETORESISTANCE SENSORS FOR POSITION AND ORIENTATION DETERMINATION

(75) Inventors: William H. Huber, Scotia, NY (US); Vernon Thomas Jensen, Draper, UT (US)

(73) Assignee: General Electric Company, Schenectady, NY (US)

( * ) Notice: Subject to any disclaimer, the term of this patent is extended or adjusted under 35 U.S.C. 154(b) by 565 days.

This patent is subject to a terminal disclaimer.

(21) Appl. No.: 12/324,169

(22) Filed: Nov. 26, 2008

(65) Prior Publication Data
US 2010/0127696 A1 May 27, 2010

(51) Int. Cl.
*G01B 7/30* (2006.01)
(52) U.S. Cl. .................... 324/252; 324/207.21
(58) Field of Classification Search ............ 324/207.21, 324/252; 338/32 R; 600/424
See application file for complete search history.

(56) References Cited

U.S. PATENT DOCUMENTS

| | | | | |
|---|---|---|---|---|
| 5,422,621 A * | 6/1995 | Gambino et al. | ............ | 338/32 R |
| 5,729,129 A | 3/1998 | Acker | | |
| 5,752,513 A | 5/1998 | Acker et al. | | |
| 5,782,765 A | 7/1998 | Jonkman | | |
| 5,818,323 A * | 10/1998 | Maeda et al. | ............... | 338/32 R |
| 6,172,499 B1 | 1/2001 | Ashe | | |
| 6,211,666 B1 * | 4/2001 | Acker | ...................... | 324/207.17 |
| 6,241,671 B1 | 6/2001 | Ritter et al. | | |
| 6,246,231 B1 | 6/2001 | Ashe | | |
| 6,427,079 B1 | 7/2002 | Schneider et al. | | |
| 6,493,573 B1 | 12/2002 | Martinelli et al. | | |
| 6,528,991 B2 | 3/2003 | Ashe | | |
| 6,610,602 B2 * | 8/2003 | Gambino et al. | ............. | 438/689 |
| 6,636,757 B1 | 10/2003 | Jascob et al. | | |
| 6,642,714 B2 * | 11/2003 | Kobayashi et al. | ........... | 324/252 |
| 6,690,963 B2 * | 2/2004 | Ben-Haim et al. | ............ | 600/424 |
| 6,701,179 B1 | 3/2004 | Martinelli et al. | | |
| 6,714,374 B1 * | 3/2004 | Hayashi et al. | ................. | 360/66 |
| 6,784,660 B2 | 8/2004 | Ashe | | |
| 6,789,043 B1 | 9/2004 | Nelson et al. | | |
| 6,812,842 B2 | 11/2004 | Dimmer | | |
| 6,822,570 B2 | 11/2004 | Dimmer et al. | | |
| 6,838,990 B2 | 1/2005 | Dimmer | | |
| 6,856,823 B2 | 2/2005 | Ashe | | |
| 7,174,202 B2 * | 2/2007 | Bladen et al. | ................. | 600/424 |
| 7,176,798 B2 | 2/2007 | Dimmer et al. | | |
| 7,324,915 B2 * | 1/2008 | Altmann et al. | .............. | 702/150 |
| 7,373,271 B1 | 5/2008 | Schneider | | |
| 7,402,996 B2 | 7/2008 | Arai et al. | | |
| 7,683,612 B2 * | 3/2010 | Koyama | ....................... | 324/249 |
| 2003/0011359 A1 | 1/2003 | Ashe | | |

(Continued)

FOREIGN PATENT DOCUMENTS
EP 42707 12/1981
(Continued)

*Primary Examiner* — Bot Ledynh

(57) ABSTRACT

A magnetoresistance sensor for use in a position and orientation tracking system includes an insulating substrate, a pattern of a metal material and/or a semiconductor material deposited on a surface of the insulating substrate, and a bias magnet material deposited over the alternating pattern of a metal material and a semiconductor material. The position and orientation tracking system includes at least one magnetoresistance reference sensor attached to a fixed object, at least one magnetoresistance sensor attached to an object being tracked, and a processor coupled to the at least one magnetoresistance reference sensor and the at least one magnetoresistance sensor.

18 Claims, 5 Drawing Sheets

U.S. PATENT DOCUMENTS

| | | |
|---|---|---|
| 2003/0173953 A1 | 9/2003 | Ashe |
| 2003/0233042 A1 | 12/2003 | Ashe |
| 2005/0245821 A1 | 11/2005 | Govari et al. |
| 2005/0261566 A1 | 11/2005 | Hanley |
| 2007/0078334 A1 | 4/2007 | Scully et al. |
| 2008/0001756 A1 | 1/2008 | Dimmer et al. |
| 2008/0269596 A1 | 10/2008 | Revie et al. |
| 2009/0058413 A1* | 3/2009 | Kraemer et al. .............. 324/252 |
| 2010/0137705 A1* | 6/2010 | Jensen et al. ................... 600/424 |
| 2010/0138183 A1* | 6/2010 | Jensen et al. ................... 702/150 |
| 2010/0249571 A1* | 9/2010 | Jensen et al. ................... 600/409 |

FOREIGN PATENT DOCUMENTS

| | | |
|---|---|---|
| JP | 2002365010 | 12/2002 |
| WO | WO9732179 | 9/1997 |
| WO | WO9960370 | 11/1999 |

* cited by examiner

MAGNETORESISTANCE SENSORS FOR POSITION AND ORIENTATION DETERMINATION

BACKGROUND OF THE INVENTION

This disclosure relates generally to magnetoresistance sensors for position and orientation determination, and more particularly to position and orientation tracking systems that use magnetic fields to determine the position and orientation of an object.

Position and orientation tracking systems are used in various industries and applications to provide position and orientation information relating to objects. For example, position and orientation tracking systems may be useful in aviation applications, industrial applications, security applications, game applications, animation applications, motion sensing applications, and medical applications. The technologies used by these systems vary to include electromagnetic (EM), radio frequency (RF), optical (line-of-sight), and mechanical.

In medical applications, position and orientation tracking systems are used to provide an operator (e.g., a physician or other medical professional) with information to assist in the precise and rapid positioning of a medical device located in or near a patient's body. In general, an image may be displayed on a monitor to provide positioning information to the operator. The image may include a visualization of the patient's anatomy with a graphical representation of the medical device displayed on the image. As the medical device is positioned with respect to the patient's body, the displayed image is updated to reflect the correct device coordinates. The base image of the patient's anatomy may be generated either prior to or during the medical procedure. For example, any suitable medical imaging technique, such as X-ray, computed tomography (CT), magnetic resonance (MR), positron emission tomography (PET), ultrasound, or any other suitable imaging technique, as well as any combinations thereof may be utilized to provide the base image displayed during tracking. After registering the base image to the position and orientation of the patient, or to the position and orientation of an anatomical feature or region of interest, the combination of the base image and the graphical representation of the tracked medical device provides position and orientation information that allows a medical practitioner to manipulate the device to a desired position and orientation.

To determine device location, position and orientation tracking systems may utilize EM sensors performing magnetic field generation and detection. At least one magnetic field is generated from one or more EM sensors (e.g., magnetic field generators or transmitters), and the at least one magnetic field is detected by one or more complementary EM sensors (e.g., magnetic field receivers). In such a system, the magnetic field may be detected by measuring the mutual inductance between the EM sensors. The measured values are processed to resolve a position and orientation of the EM sensors relative to one another.

EM sensors are typically implemented with coils to generate and detect the magnetic fields. While coil based EM sensors have been successfully implemented, they suffer from poor signal-to-noise ratio (SNR) as the transmitter coil frequency is reduced and/or the receiver coil volume is reduced. Reducing the SNR translates into a reduced range (distance from transmitter to receiver) of the EM sensors that may result in a clinically meaningful position error.

A problem associated with coil based EM sensors is that they are susceptible to magnetic field distortions that arise from eddy currents in nearby conducting objects. The tracking technique used with coil based EM sensors relies on a stable magnetic field, or a known magnetic field map. Therefore, unpredictable disturbances resulting from metallic objects in the magnetic field reduce the accuracy or may even render the tracking technique useless. Selecting a magnetic field frequency as low as the application allows reduces problems resulting from eddy currents, however it also reduces the sensitivity of coil based EM sensors since these are based on induction.

Other problems associated with coil based EM sensors is that they are generally expensive to manufacture and are also inherently sensitive to parasitic inductance and capacitance from the cables, connectors and electronics because the sensor signal is proportionally smaller while the parasitic signal remains the same. While some of the parasitic contributions may be partially nulled out using more expensive components and manufacturing processes, the remaining parasitic inductance and capacitance result in a reduced range.

In addition to coil based EM sensors, there are a large variety of magnetic sensors with differing price and performance attributes. Hall effect-sensors are typically used to detect fields down to approximately $10^{-6}$ Tesla. These sensors are stable, compact, relatively inexpensive and have a large dynamic range. Anisotropic magnetoresistive (AMR) sensors can detect fields down to approximately $10^{-9}$ Tesla. While these sensors are compact and relatively inexpensive, they are highly prone to drift and have a small dynamic range. Therefore AMR sensors need to be reinitialized frequently using high current pulses. Fluxgate magnetometers can detect fields down to approximately $10^{-11}$ Tesla. However these sensors are expensive, bulky and have a relatively small dynamic range. SQUID magnetometers can detect fields down to approximately $10^{-15}$ Tesla. They are also expensive with significant operating costs since they require cryogens or a high-power closed-cycle cooling system.

Therefore, there is a need for a position and orientation tracking system having magnetoresistance sensors that have a small form factor, excellent signal-to-noise ratio, excellent low frequency operation, lower sensitivity to parasitic inductance and capacitance, lower sensitivity to distortion, and are very low cost to manufacture.

BRIEF DESCRIPTION OF THE INVENTION

In accordance with an aspect of the disclosure, a magnetoresistance sensor for use with a position and orientation tracking system comprising an insulating substrate; an alternating pattern of a metal material and a semiconductor material deposited on a surface of the insulating substrate; a bias magnet material deposited over the alternating pattern of a metal material and a semiconductor material.

In accordance with an aspect of the disclosure, a position and orientation tracking system comprising at least one magnetoresistance reference sensor attached to a fixed object; at least one magnetoresistance sensor attached to an object being tracked; and a processor coupled to the at least one magnetoresistance reference sensor and the at least one magnetoresistance sensor.

In accordance with an aspect of the disclosure, a position and orientation tracking system comprising at least one magnetoresistance reference sensor attached to a fixed object; at least one magnetoresistance sensor attached to an object being tracked; a processor coupled to the at least one magnetoresistance reference sensor and the at least one magnetoresistance sensor; and a user interface coupled to the processor.

Various other features, aspects, and advantages will be made apparent to those skilled in the art from the accompanying drawings and detailed description thereof.

DETAILED DESCRIPTION OF THE INVENTION

Figure 1:
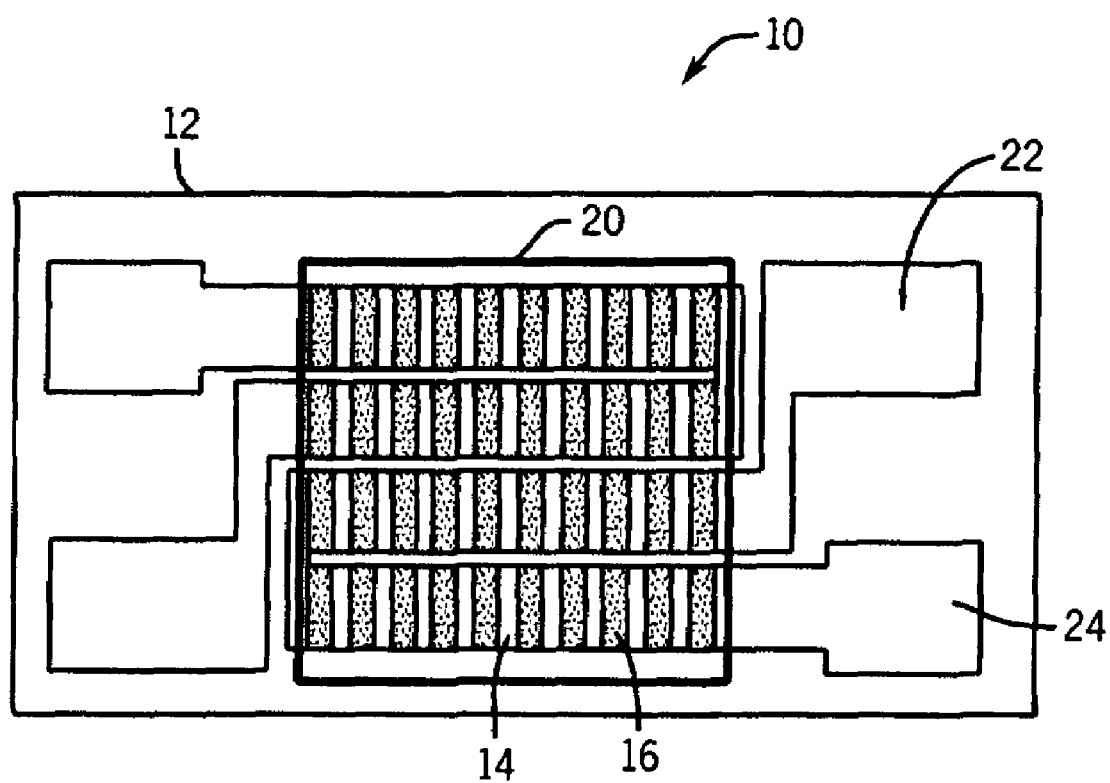
FIG. 1 is an enlarged top view of an exemplary embodiment of a magnetoresistance sensor.
Figure 2:
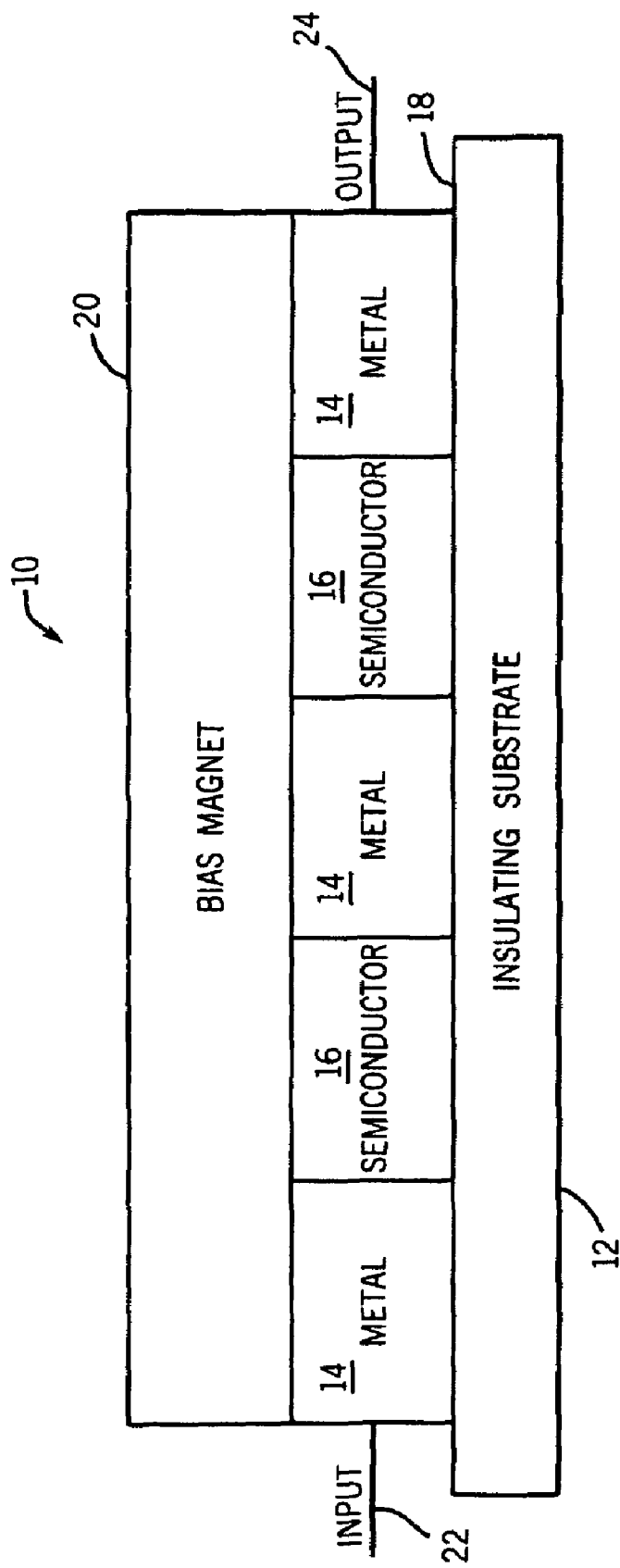
FIG. 2 is an enlarged side view of an exemplary embodiment of a magnetoresistance sensor.

Referring now to the drawings, FIG. 1 illustrates an enlarged top view of an exemplary embodiment of a magnetoresistance sensor 10. A magnetoresistance device is a device that provides a change in electrical resistance of a conductor or semiconductor when a magnetic field is applied. The device's resistance depends upon the magnetic field applied. As shown in FIG. 2, the a magnetoresistance sensor 10 comprises an insulating substrate 12, an alternating pattern of a metal material 14 and a semiconductor material 16 deposited on a surface 18 of the insulating substrate, and a bias magnet material 20 deposited over the alternating pattern of metal material 14 and semiconductor material 16. FIG. 2 illustrates an enlarged side view of an exemplary embodiment of a magnetoresistance sensor 10. The alternating pattern of metal material 14 and semiconductor material 16 creates a composite structure with alternating bands of metal material 14 and semiconductor material 16. At least one input connection contact 22 is coupled to the metal material 14 and at least one output connection contact 24 is coupled to the metal material 14.

The semiconductor material 16 may be series connected to increase the magnetoresistance sensor 10 resistance. In an exemplary embodiment, the semiconductor material 16 may be comprised of a single semiconductor element. The bias magnet material 20 subjects the semiconductor material 16 to a magnetic field required to achieve required sensitivity. The magnetoresistance sensor 10 provides a signal in response to the strength and direction of a magnetic field. The magnetic field may be approximately 0.1 to 0.2 Tesla.

The application of a magnetic field confines the electrons to the semiconductor material 16, resulting in an increased path length. Increasing the path length, increases the sensitivity of the magnetoresistance sensor 10. The magnetic field also increases the resistance of the magnetoresistance sensor 10. In the geometry disclosed in FIGS. 1 and 2, at a zero magnetic field, the current density is uniform throughout the magnetoresistance sensor 10. At a high magnetic field, the electrons (or holes) propagate radially outward toward the corners of the semiconductor material 16, resulting in a large magnetoresistance (high resistance).

Many new clinical applications include tracking of a variety of devices including catheters, guidewires, and other endovascular instruments that require sensors to be very small in size (millimeter dimensions or smaller). The form factor of the magnetoresistance sensor 10 may be scaled to sizes less than 0.1 mm×0.1 mm.

In an exemplary embodiment, the magnetoresistance sensor may be built with various architectures and geometries, including, giant magnetoresistance (GMR) sensors, and extraordinary magnetoresistance (EMR) sensors.

The magnetoresistance sensor 10 provides a very small form factor, excellent signal-to-noise ratio (low noise operation), and excellent low frequency response. Low noise combined with wide dynamic range enables the magnetoresistance sensor 10 to be used for position and orientation tracking. The low frequency response of the magnetoresistance sensor 10 allows a position and orientation tracking system to operate at very low frequencies where metal tolerance is maximized.

Figure 3:
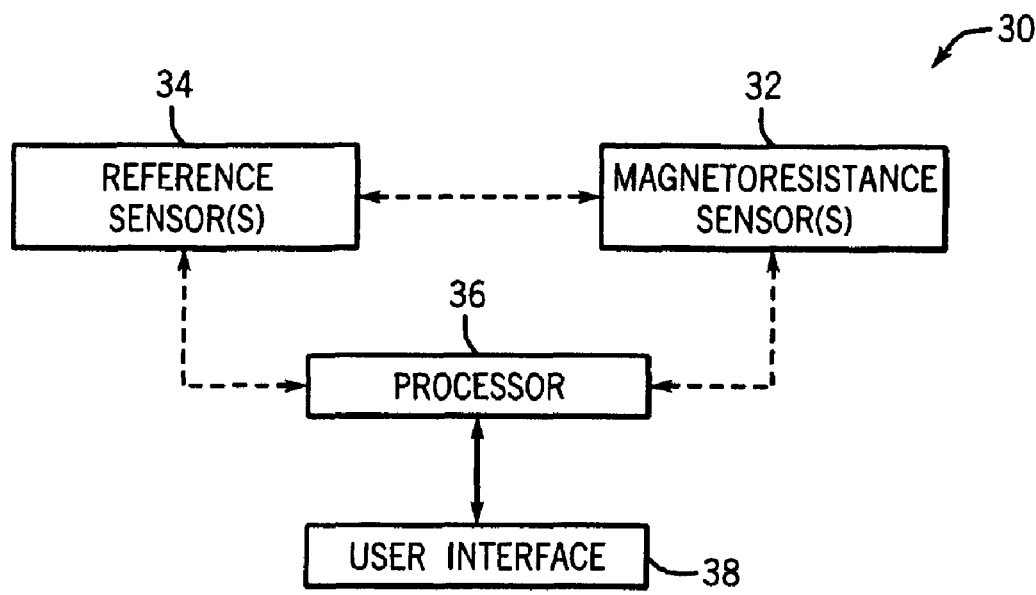
FIG. 3 is a block diagram of an exemplary embodiment of a position and orientation tracking system.

FIG. 3 illustrates a block diagram of an exemplary embodiment of a position and orientation tracking system 30. The position and orientation tracking system 30 may include at least one magnetoresistance sensor 32 and at least one magnetoresistance reference sensor 34. The at least one magnetoresistance sensor 32 may be used to determine one dimension or multiple dimensions of position and/or orientation information relative to the at least one magnetoresistance reference sensor 34, or relative to one or more magnetoresistance sensor 32. The at least one magnetoresistance sensor 32 and at least one magnetoresistance reference sensor 34 are coupled to at least one processor 36. In turn, the at least one processor 36 is coupled to a user interface 38. The user interface 38 may include a display for displaying position and orientation information to an operator.

The at least one magnetoresistance sensor 32 is attached to at least one object to be tracked. The at least one magnetoresistance reference sensor 34 is attached to a fixed object. The at least one magnetoresistance reference sensor 34 communicates with and receives data from the at least one magnetoresistance sensor 32. The at least one processor 36 is coupled to and receives data from the at least one magnetoresistance reference sensor 34 and the at least one of magnetoresistance sensor 32. The position and orientation tracking system 30 provides the ability to track and display the position and orientation of multiple objects having magnetoresistance sensors 32 attached thereto.

The at least one magnetoresistance sensor 32 and the at least one magnetoresistance reference sensor 34 may be coupled to and communicate to the processor 36 through either a wired or wireless connection.

In an exemplary embodiment, the at least one magnetoresistance sensor 32 may be configured as a transmitter or magnetic field generator, and the at least one magnetoresistance reference sensor 34 may be configured as a magnetic field receiver. It should, however, be appreciated that according to alternate embodiments the at least one magnetoresistance sensor 32 may be configured as a magnetic field receiver, and the at least one magnetoresistance reference sensor 34 may be configured as a magnetic field generator.

In an exemplary embodiment, the at least one magnetoresistance reference sensor 34 generates at least one magnetic field that is detected by at least one magnetoresistance sensor 32. In an exemplary embodiment, the at least one magnetoresistance sensor 32 generates at least one magnetic field that is detected by at least one magnetoresistance reference sensor 34.

The magnetic field measurements may be used to calculate the position and orientation of the objects being tracked according to any suitable method or system. After the magnetic field measurements are digitized using electronics coupled to the at least one magnetoresistance sensor 32, the digitized signals are transmitted from the at least one magnetoresistance sensor 32 to the processor 36. The digitized signals may be transmitted from the at least one magnetoresistance sensor 32 to the processor 36 using wired or wireless communication protocols and interfaces. The digitized signals received by the processor represent magnetic field information detected by the at least one magnetoresistance sensor 32.

In an exemplary embodiment, the digitized signals received by the processor 36 represent magnetic field information from the at least one magnetoresistance reference sensor 34 detected by the at least one or at least one magnetoresistance sensor 32. The processor 36 calculates position and orientation information of the objects being tracked based on the received digitized signals.

The processor 36 receives and/or transmits digitized signals from at least one magnetoresistance reference sensor 34 or at least one magnetoresistance sensor 32. According to various exemplary embodiments, the digitized signals may be transmitted from the at least one magnetoresistance reference sensor 34 or at least one magnetoresistance sensor 32 to the processor 36 using alternative wired or wireless communication protocols and interfaces.

The position and orientation information may be transmitted to the user interface 38 for review by the operator.

The processor 36 is illustrated conceptually and may be implemented using any combination of dedicated hardware boards, digital signal processors, field programmable gate arrays, and processors. For example, the processor 36 may include memory, which may be either volatile or non-volatile media. In addition, the processor 36 may also include either removable or non-removable storage media. Alternatively, the processor 36 may be implemented using an off-the-shelf computer with a single processor or multiple processors, with the functional operations distributed between processors.

An exemplary system for implementing the processor 36 and/or user interface 38 may include a general purpose computing device in the form of a computer, including a processing unit, a system memory, and a system bus that couples various system components including the system memory to the processing unit. The system memory may include read only memory (ROM) and random access memory (RAM). The computer may also include a magnetic hard disk drive for reading from and writing to a magnetic hard disk, a magnetic disk drive for reading from or writing to a removable magnetic disk, and an optical disk drive for reading from or writing to a removable optical disk such as a CD ROM or other optical media. The drives and their associated machine-readable media provide nonvolatile storage of machine-executable instructions, data structures, program modules and other data for the computer.

Figure 4:
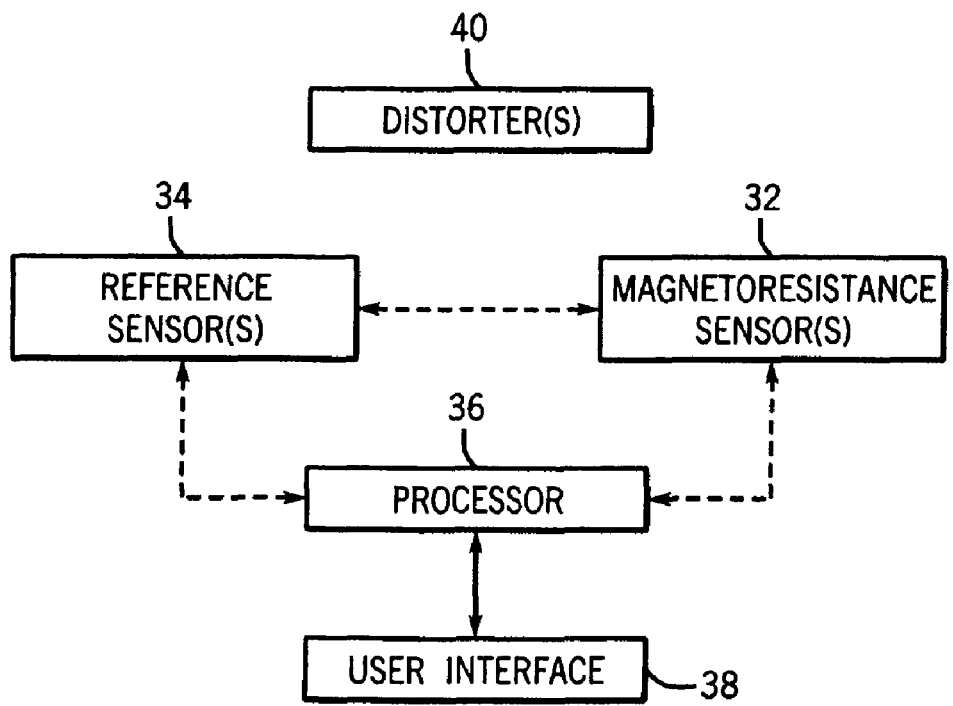
FIG. 4 is a block diagram of an exemplary embodiment of a position and orientation tracking system within the presence of at least one distorter.

FIG. 4 illustrates a block diagram of an exemplary embodiment of a position and orientation tracking system 30 within the presence of at least one distorter 40. The at least one distorter 40 may distort the magnetic fields and thus skew the measurements of position and orientation of the objects being tracked.

Eddy currents associated with the at least one detector 40 near the position and tracking system 30 may cause significant distortions in the magnetic field, resulting in significant errors in the calculated position and orientation of the position and orientation tracking system 30. These distortions may result in meaningful errors even at relatively close ranges.

The use of magnetoresistance sensors in the position and orientation tracking system allows significant improvements in immunity to disturbances from metallic objects, when compared with state of the art electromagnetic position and orientation tracking systems. Magnetoresistance sensors have an excellent low noise response that extends from steady state (DC) magnetic fields up to 100s of kHz. The low frequency performance allows the transmitter generated magnetic fields to oscillate at frequencies low enough to avoid significant disturbances from eddy currents induced in metallic objects. Frequencies lower than 100 Hz show significant improvements in tolerance to distortions from metallic objects.

Therefore, a magnetoresistance based EM tracking system can be operated in a frequency regime low enough to minimize position errors associated with eddy currents while still maintaining a clinically useful range in severely constrained geometries such as guidewires, catheters, needles, and other endovascular medical devices.

Figure 5:
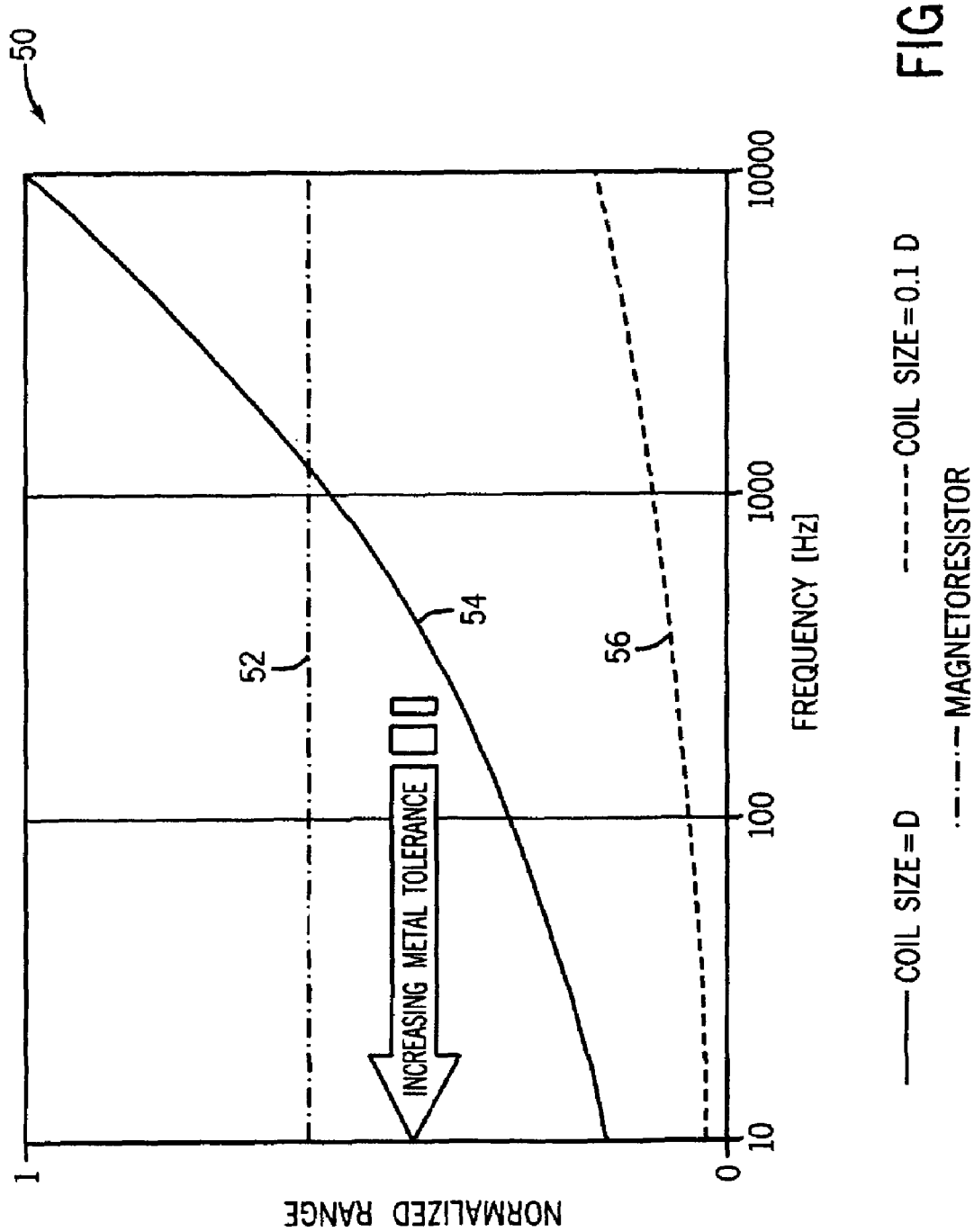
FIG. 5 is a graphical representation of a range versus frequency comparison between a magnetoresistance sensor and two different sized coils in a position and orientation tracking system.

FIG. 5 illustrates a graphical representation of a range versus frequency comparison 50 between a magnetoresistance sensor 52 and two different sized coils 54, 56 in a position and orientation tracking system.

Compared to a coil based EM sensor, a magnetoresistance sensor does not require an undesirable tradeoff between transmitter frequency, coil volume and maximum range as shown in FIG. 5. Therefore, a magnetoresistance sensor used in a position and orientation tracking system may be operated at frequencies low enough to minimize position and orientation errors associated with eddy currents while still maintaining a clinically useful range in severely constrained geometries such as guidewires, catheters and other endovascular medical devices.

Magnetoresistance sensors are intrinsically independent of frequency and may be scaled to sizes less than 0.1 mm×0.1 mm without appreciable loss in signal fidelity.

Figure 6:
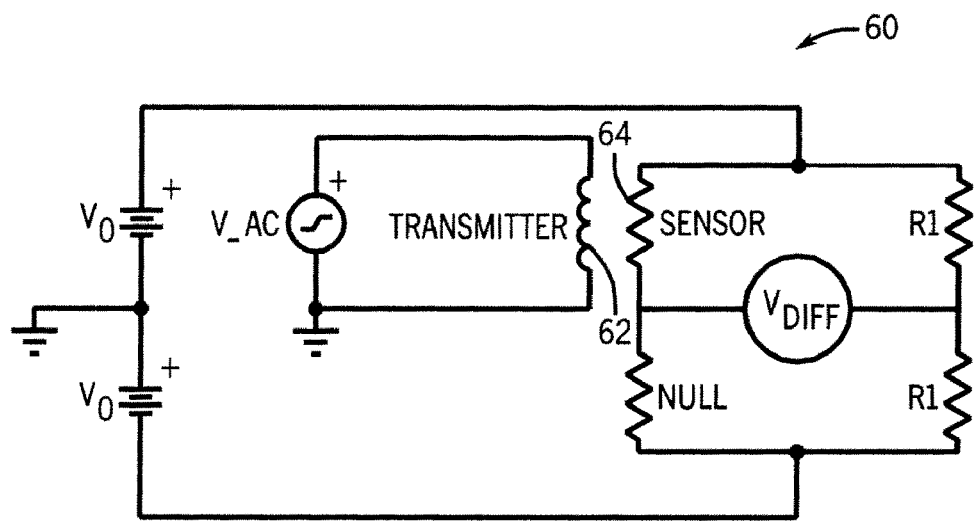
FIG. 6 is a schematic diagram of an exemplary embodiment of an electrical configuration of magnetoresistance sensors for use in a position and orientation tracking system.
Figure 7:
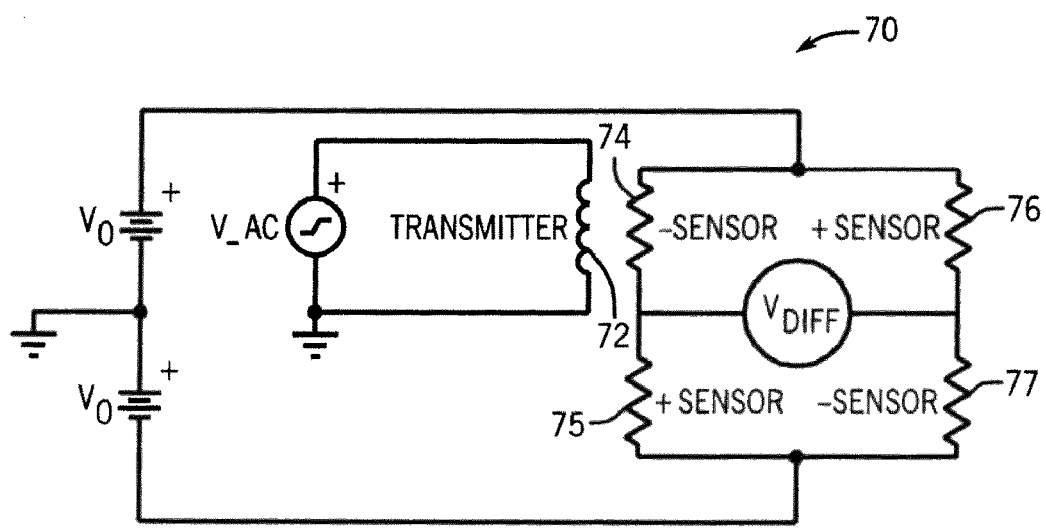
FIG. 7 is a schematic diagram of an exemplary embodiment of an electrical configuration of magnetoresistance sensors for use in a position and orientation tracking system.

A magnetoresistance sensor based position and orientation tracking system utilizing phase sensitive detection is much less susceptible to parasitic inductances and capacitances from cables, connectors, readout electronics or other sources. Representative configurations are shown in FIGS. 6 and 7. FIG. 6 illustrates a schematic diagram of an exemplary embodiment of an electrical configuration of magnetoresistance sensors for use in a position and orientation tracking system. In this configuration a one-quarter DC Wheatstone bridge 60 is used to detect an AC magnetic field from a transmitter 62. As is known in the art, a balanced Wheatstone bridge is often used to measure small changes in resistances. By utilizing phase sensitive detection, the real component of the magnetoresistance sensor 64 output may be separately determined even in the presence of a large parasitic contribution.

The transmitter 62 is driven at a frequency w. A DC bias voltage $V_O$ is applied to the bridge 60. The null resistor is tuned to minimize the DC voltage. The phase shift is determined by measuring the output signal at zero bridge bias. Any signal must be associated with parasitic inductance and capacitance. Adjust the phase accordingly. Use lock-in amplifier to measure AC voltage at reference frequency. The real component is the AC magnetic field. The imaginary component is the parasitic inductance and capacitance.

FIG. 7 is a schematic diagram of an exemplary embodiment of an electrical configuration of magnetoresistance sensors for use in a position and orientation tracking system. In this configuration a full DC Wheatstone bridge 70 is used to detect an AC magnetic field from a transmitter 72. As is known in the art, a balanced Wheatstone bridge is often used to measure small changes in resistances. By utilizing phase sensitive detection, the real component of the magnetoresistance sensors output may be separately determined even in the presence of a large parasitic contribution.

Sensors 74, 75, 76, 77 are on all arms of the bridge. The sensors 74, 77 in the upper left and lower right are biased negatively. A positive magnetic field results in a negative change in resistance. The sensors 75, 76 in the lower left and upper right are biased positively. A positive magnetic field results in a positive change in resistance.

The pros of using the full bridge compared to the one-quarter bridge is that the full bridge provides a higher signal level and it is less susceptible to temperature drifts. The cons of using the full bridge compared to the one-quarter bridge is the larger footprint of the full bridge and it is more difficult to fabricate.

The advantages of using magnetoresistance sensors for position and orientation determination is that the magnetoresistance sensors provide a very low cost to manufacture, a very small form factor, excellent signal-to-noise ratio for size and based on Wheatstone bridge designs, and low frequency operation provides low sensitivity to distortion.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

While the disclosure has been described with reference to various embodiments, those skilled in the art will appreciate that certain substitutions, alterations and omissions may be made to the embodiments without departing from the spirit of the disclosure. Accordingly, the foregoing description is meant to be exemplary only, and should not limit the scope of the disclosure as set forth in the following claims.

What is claimed is:

1. A magnetoresistance sensor for use with a position and orientation tracking system comprising:
   an insulating substrate;
   an alternating pattern of a metal material and a semiconductor material deposited on a surface of the insulating substrate; and
   a bias magnet material deposited on a surface of the alternating pattern of the metal material and the semiconductor material;
   wherein the alternating pattern of the metal material and the semiconductor material is between the insulating substrate and the bias magnet material.

2. The magnetoresistance sensor of claim 1, further comprising at least one input connection contact coupled to the metal material.

3. The magnetoresistance sensor of claim 1, further comprising at least one output connection contact coupled to the metal material.

4. The magnetoresistance sensor of claim 1, wherein the semiconductor material is connected in series to increase the resistance of the magnetoresistance sensor.

5. The magnetoresistance sensor of claim 1, wherein the semiconductor material is comprised of a single semiconductor element.

6. The magnetoresistance sensor of claim 1, wherein the bias magnet material subjects the semiconductor material to a magnetic field.

7. The magnetoresistance sensor of claim 6, wherein the magnetoresistance sensor provides a signal in response to a strength and a direction of the magnetic field.

8. The magnetoresistance sensor of claim 6, wherein the magnetic field increases the resistance of the magnetoresistance sensor.

9. The magnetoresistance sensor of claim 1, wherein the magnetoresistance sensor is approximately 0.1 mm by 0.1 mm in size.

10. A position and orientation tracking system comprising:
    at least one magnetoresistance reference sensor attached to a fixed object;
    at least one magnetoresistance sensor attached to an object being tracked; and
    a processor coupled to the at least one magnetoresistance reference sensor and the at least one magnetoresistance sensor;
    wherein the at least one magnetoresistance reference sensor and the at least one magnetoresistance sensor each comprising:
    an insulating substrate;
    an alternating pattern of a metal material and a semiconductor material deposited on a surface of the insulating substrate; and
    a bias magnet material deposited on a surface of the alternating pattern of the metal material and the semiconductor material;
    wherein the alternating pattern of the metal material and the semiconductor material is between the insulating substrate and the bias magnet material.

11. The position and orientation tracking system of claim 10, wherein the processor calculates the position and orientation of the object being tracked.

12. The position and orientation tracking system of claim 10, further comprising a user interface coupled to the processor.

13. The position and orientation tracking system of claim 12, wherein the user interface provides visualization of the position and orientation data to an operator.

14. The position and orientation tracking system of claim 10, wherein the at least one magnetoresistance reference sensor and the at least one magnetoresistance sensor are unaffected by the presence of a metallic distorter within the position and orientation tracking system.

15. A position and orientation tracking system comprising:
    at least one magnetoresistance reference sensor attached to a fixed object;
    at least one magnetoresistance sensor attached to an object being tracked;
    a processor coupled to the at least one magnetoresistance reference sensor and the at least one magnetoresistance sensor; and
    a user interface coupled to the processor;
    wherein the at least one magnetoresistance reference sensor and the at least one magnetoresistance sensor each comprising:
    an insulating substrate;

an alternating pattern of a metal material and a semiconductor material deposited on a surface of the insulating substrate; and a bias magnet material deposited on a surface of the alternating pattern of the metal material and the semiconductor material;

wherein the alternating pattern of the metal material and the semiconductor material is between the insulating substrate and the bias magnet material.

16. The position and orientation tracking system of claim 15, wherein the processor calculates position and orientation data of the object being tracked.

17. The position and orientation tracking system of claim 15, wherein the user interface provides visualization of the position and orientation data to an operator.

18. The position and orientation tracking system of claim 10, wherein the at least one magnetoresistance reference sensor and the at least one magnetoresistance sensor are unaffected by the presence of a metallic distorter within the position and orientation tracking system.

* * * * *